United States Patent
Wang

(10) Patent No.: US 12,165,913 B2
(45) Date of Patent: Dec. 10, 2024

(54) METHOD FOR MANUFACTURING SEMICONDUCTOR DEVICE AND SEMICONDUCTOR DEVICE

(71) Applicant: CHANGXIN MEMORY TECHNOLOGIES, INC., Hefei (CN)

(72) Inventor: Suli Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 492 days.

(21) Appl. No.: 17/449,812

(22) Filed: Oct. 3, 2021

(65) Prior Publication Data

US 2023/0010843 A1    Jan. 12, 2023

Related U.S. Application Data

(63) Continuation of application No. PCT/CN2021/107906, filed on Jul. 22, 2021.

(30) Foreign Application Priority Data

Jul. 12, 2021 (CN) .......................... 202110785513.8

(51) Int. Cl.
  *H01L 21/768* (2006.01)
  *H01L 21/02* (2006.01)
  *H01L 23/522* (2006.01)

(52) U.S. Cl.
  CPC .. *H01L 21/76802* (2013.01); *H01L 21/02063* (2013.01); *H01L 21/76877* (2013.01); *H01L 21/76885* (2013.01); *H01L 23/5226* (2013.01)

(58) Field of Classification Search
  CPC ......... H01L 21/76802; H01L 21/02063; H01L 21/76877; H01L 21/76885; H01L 23/5226;
  (Continued)

(56) References Cited

U.S. PATENT DOCUMENTS 6,806,188 B2   10/2004  Kim
2009/0014028 A1*  1/2009  Hirota ................. H01L 21/6708
                                                                    134/1

(Continued)

FOREIGN PATENT DOCUMENTS

CN       1381875 A     11/2002
CN    101989570 A      3/2011
(Continued)

OTHER PUBLICATIONS

International Search Report (ISR) in Application No. PCT/CN2021/107906, mailed on Apr. 13, 2022.

*Primary Examiner* — Jonathan Han
(74) *Attorney, Agent, or Firm* — Syncoda LLC; Feng Ma

(57) ABSTRACT

A method for manufacturing a semiconductor device includes: forming an isolating layer on a surface of a substrate; forming a groove on the isolating layer, where the groove penetrates the isolating layer; forming a protection layer in the groove and on the isolating layer; forming a dielectric layer on the protection layer; and forming a contact hole, where the contact hole penetrates the protection layer and the dielectric layer to the surface of the substrate, respectively. The method for manufacturing the semiconductor device according to the present invention can be used not only in chemical vapor deposition but also in a process of a metal wire of a short-circuit in physical vapor deposition.

10 Claims, 9 Drawing Sheets

(58) Field of Classification Search
CPC ......... H01L 21/76814; H01L 21/76828; H01L 21/76801
See application file for complete search history.

(56) References Cited

U.S. PATENT DOCUMENTS

| | | | | |
|---|---|---|---|---|
| 2010/0109161 | A1* | 5/2010 | Schuehrer | H01L 21/76832 257/762 |
| 2011/0034025 | A1* | 2/2011 | Nie | H01L 21/2855 438/643 |
| 2019/0237402 | A1* | 8/2019 | Briggs | H01L 21/76847 |
| 2020/0159106 | A1* | 5/2020 | Fukugami | G03F 1/54 |
| 2021/0313223 | A1* | 10/2021 | Huang | H01L 21/76816 |
| 2022/0367348 | A1* | 11/2022 | Chang | H01L 21/76877 |

FOREIGN PATENT DOCUMENTS

| | | | |
|---|---|---|---|
| CN | 102468223 | A | 5/2012 |
| CN | 103151301 | A | 6/2013 |
| CN | 104867832 | A | 8/2015 |
| CN | 111739839 | A | 10/2020 |

* cited by examiner

METHOD FOR MANUFACTURING SEMICONDUCTOR DEVICE AND SEMICONDUCTOR DEVICE

CROSS-REFERENCE TO RELATED APPLICATIONS

This is a continuation of International Patent Application No. PCT/CN2021/107906 filed on Jul. 22, 2021, which claims priority to Chinese Patent Application No. 202110785513.8 filed on Jul. 12, 2021. The disclosures of the above-referenced applications are hereby incorporated by reference in their entirety.

BACKGROUND

In a manufacturing process of a semiconductor device, tetraethyl silicate (TEOS) is widely used to dope boron and phosphorus, and borophosphosilicate glass (BPSG) is formed as a pre-metal dielectric layer (PMD) with a CVD (chemical vapor deposition) method.

SUMMARY

The present disclosure relates generally to the field of semiconductor technologies, and more specifically to a method for manufacturing a semiconductor device, and a semiconductor device.

In a first aspect, various embodiments of the present disclosure provide a method for manufacturing a semiconductor device, including: forming an isolating layer on a surface of a substrate; forming a groove in the isolating layer, where the groove penetrates the isolating layer, and a cross-section area of a side of the groove close to the substrate gradually increases to the cross-section area of the side of the groove away from the substrate; forming a protection layer in the groove and on the isolating layer; forming a dielectric layer on the protection layer; forming a contact hole, where the contact hole penetrates the protection layer and the dielectric layer to the surface of the substrate, respectively.

According to another aspect of the present disclosure, there is provided a semiconductor device, which is manufactured with the method in any one of the forgoing solutions.

According to yet another aspect of the present disclosure, there is provided a semiconductor device, including: a substrate; where a dielectric layer, a protection layer, and an isolating layer are stacked on a surface of the substrate in sequence, and the surface of the substrate is directly covered with the isolating layer; and a contact hole, where the contact hole penetrates the dielectric layer, the protection layer, and the isolating layer, where a connection position between the isolating layer and the contact hole is covered with the protection layer.

REFERENCE NUMERALS

Figure 1:
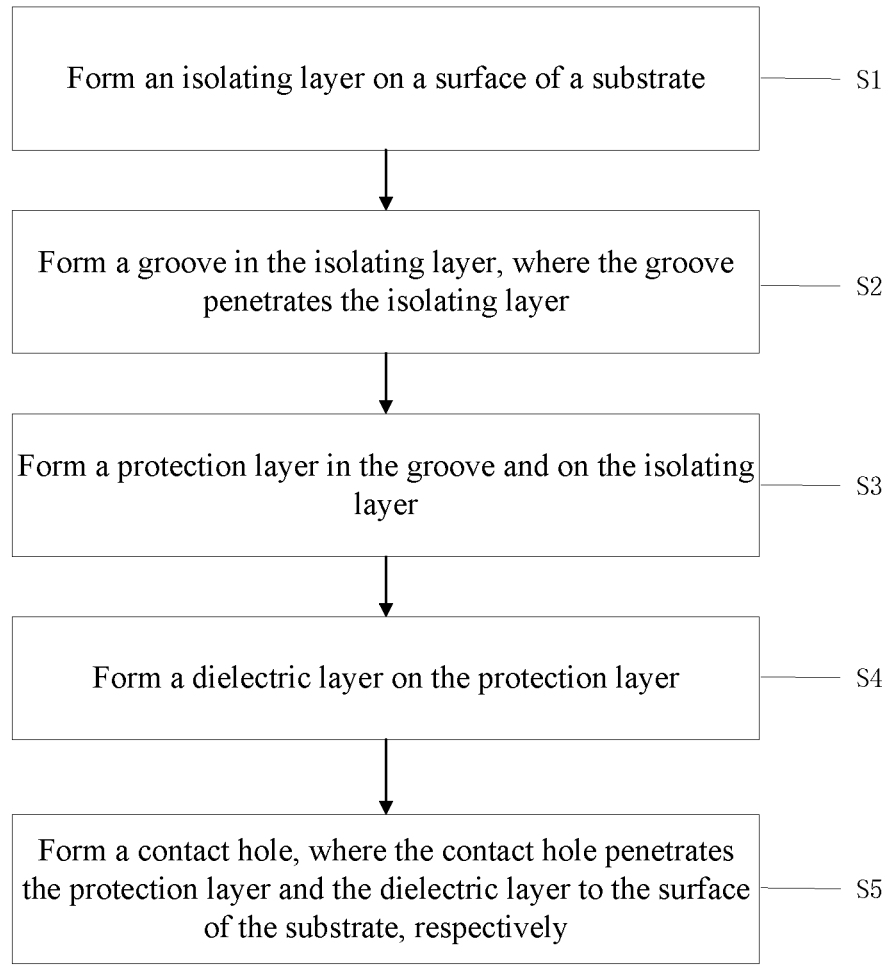
FIG. 1 is a flowchart of a method for manufacturing a semiconductor device according to an embodiment of the present disclosure.

100: Substrate; 200: Isolating Layer; 300: Groove; 400: Protection Layer; 500: Dielectric Layer; 600: Contact Hole; 700: Conductive Plug; 800: Metal Conductive Layer.

DETAILED DESCRIPTION

In order to make objectives, technical solutions, and advantages of the present disclosure clearer, the following further describes the present disclosure in detail in conjunction with specific embodiments and with reference to drawings. It should be understood that these descriptions are only exemplary and not intended to limit the scope of the present disclosure. In addition, in the following description, descriptions of well-known structures and technologies are omitted to avoid unnecessary confusion of the concept of the present disclosure.

The drawing shows a schematic diagram of a layer structure according to an embodiment of the present disclosure. The figures are not drawn to scale, in which some details are exaggerated for clarity objectives, and some details may be omitted. The shapes of the various regions and layers shown in the figures as well as a relative size and a positional relationship among the regions and the layers are only exemplary. In practice, deviations may be provided due to manufacturing tolerances or technical limitations, and those skilled in the art can additionally design areas/layers with different shapes, sizes, and relative positions according to actual needs.

Apparently, the described embodiments are part of the embodiments of the present disclosure, rather than all of the embodiments. Based on the embodiments of the present disclosure, all other embodiments obtained by those skilled in the art without inventive work shall fall within the protection scope of the present disclosure.

In addition, the technical features involved in different embodiments of the present disclosure described below can be combined with each other as long as the technical features do not conflict with each other.

The following describes the present disclosure in a more details with reference to the drawings. In the various drawings, same elements are denoted by similar reference signs. For the sake of clarity, the various parts in the drawings are not drawn to scale.

A borophosphosilicate glass has a good step coverage ability after high-temperature reflow, which is beneficial to planarization of a subsequent metal layer. The borophosphosilicate glass has a strong ability to absorb water vapor. At a certain concentration of phosphorus, phosphorus is easily precipitated from a borophosphosilicate glass film and exists in a form of phosphorus pentoxide. When encountering water vapor in an environment, phosphorus is easy to combine to form phosphoric acid. Especially in a process with a chemical cleaning agent or for a film that is exposed to air for a long time, the precipitated phosphorus has a greater probability to be combined with water to form phosphoric acid. Even if other materials are used as a metal dielectric layer, other types of acidic substances are still formed. Acid corrodes the isolating layer, resulting in loss of a PMD structure, and metal filling causes short-circuit failure of a device.

FIG. 1 is a flowchart of a method for manufacturing a semiconductor device according to an embodiment of the present disclosure.

As shown in FIG. 1, in an embodiment of the present disclosure, there is provided a method for manufacturing a semiconductor device, including the following steps.

Figure 2:
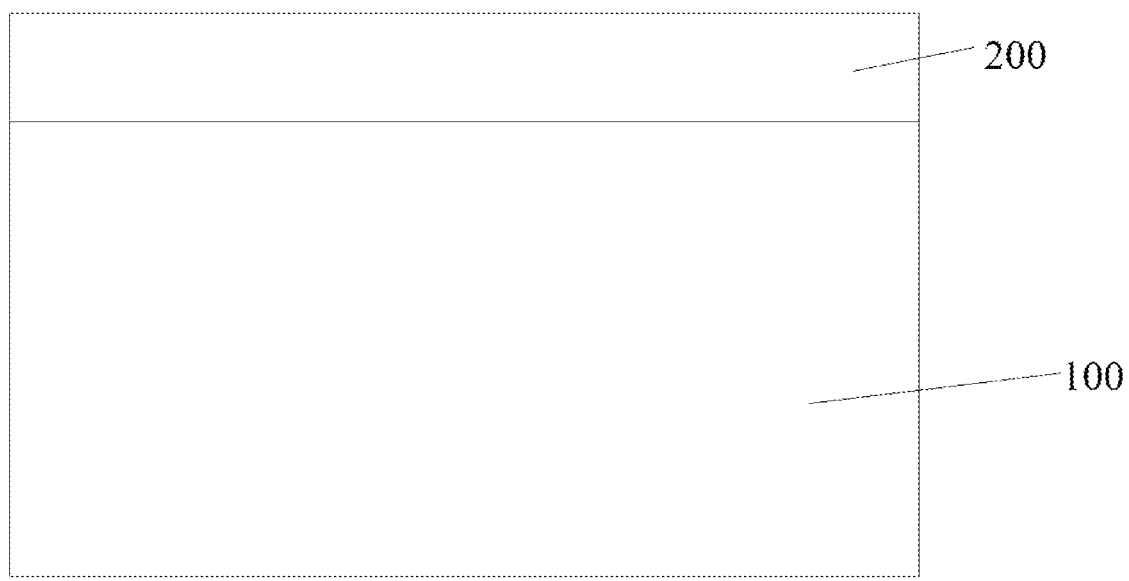
FIG. 2 is a schematic diagram of a structure in which an isolating layer is manufactured on a surface of a substrate according to an embodiment of the present disclosure.

FIG. 2 is a schematic diagram of a structure in which an isolating layer is manufactured on a surface of a substrate according to an embodiment of the present disclosure.

As shown in FIG. 2,
S1: forming an isolating layer 200 on a surface of a substrate 100.

Figure 3:
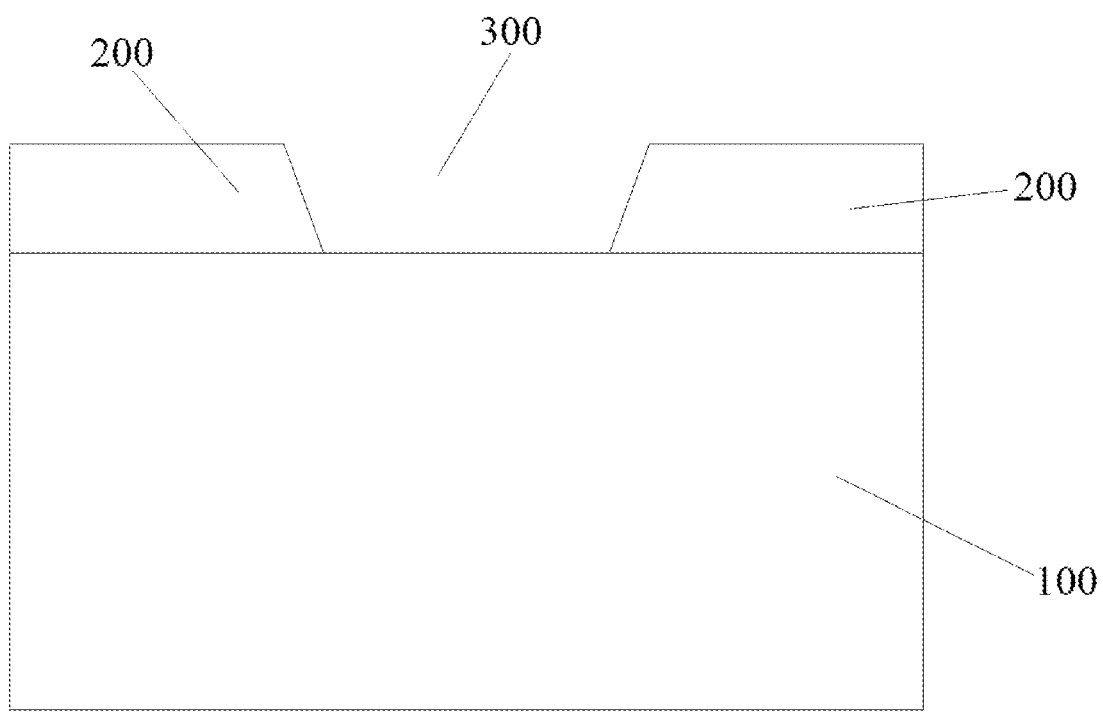
FIG. 3 is a schematic diagram of a structure in which the isolating layer is opened and provided with a groove according to an embodiment of the present disclosure.

FIG. 3 is a schematic diagram of a structure in which the isolating layer is opened and provided with a groove according to an embodiment of the present disclosure.

As shown in FIG. 3,
S2: forming a groove 300 in the isolating layer 200, where the groove 300 penetrates the isolating layer 200.

Figure 4:
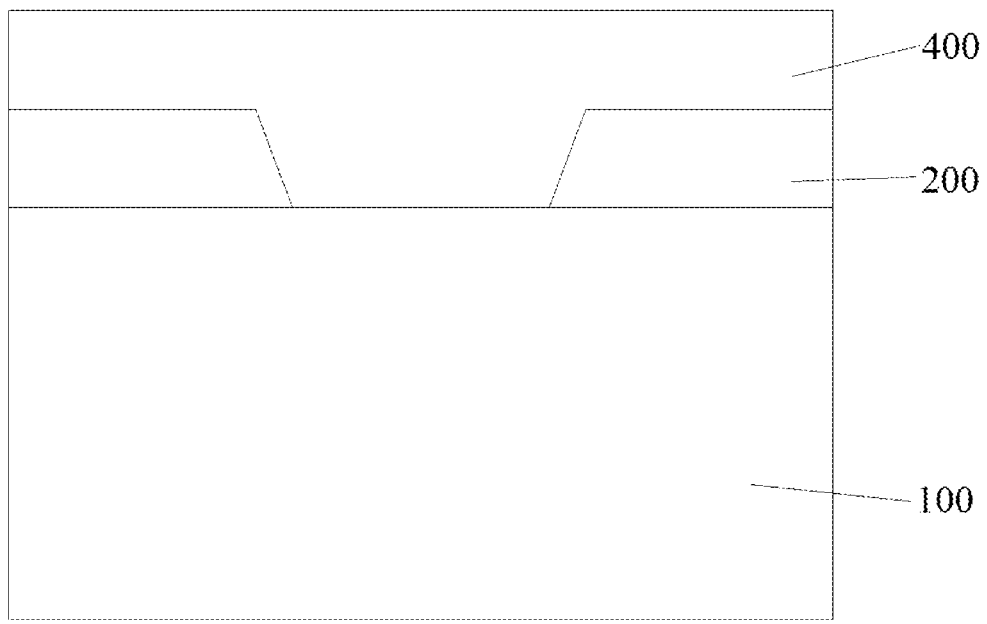
FIG. 4 is a schematic diagram of a structure in which a protection layer is formed in the groove and on the isolating layer according to an embodiment of the present disclosure.

FIG. 4 is a schematic structural diagram of a structure in which a protection layer is formed in the groove and on the isolating layer according to an embodiment of the present disclosure.

As shown in FIG. 4,
S3: forming a protection layer 400 in the groove 300 and on the isolating layer 200.

Figure 5:
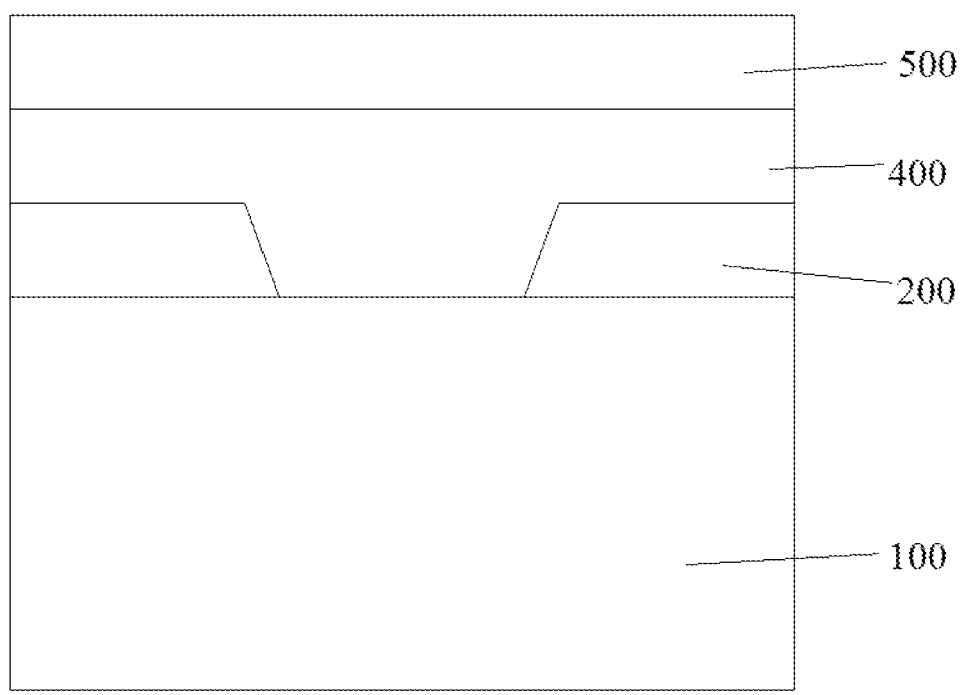
FIG. 5 is a schematic diagram of a structure in which a dielectric layer is formed on a protection layer according to an embodiment of the present disclosure.

FIG. 5 is a schematic diagram of a structure in which a dielectric layer is formed on the protection layer according to an embodiment of the present disclosure.

As shown in FIG. 5,
S4: forming a dielectric layer 500 on the protection layer 400.
S41: polishing a surface of the dielectric layer 500 with chemical mechanical polishing technology.

Figure 6:
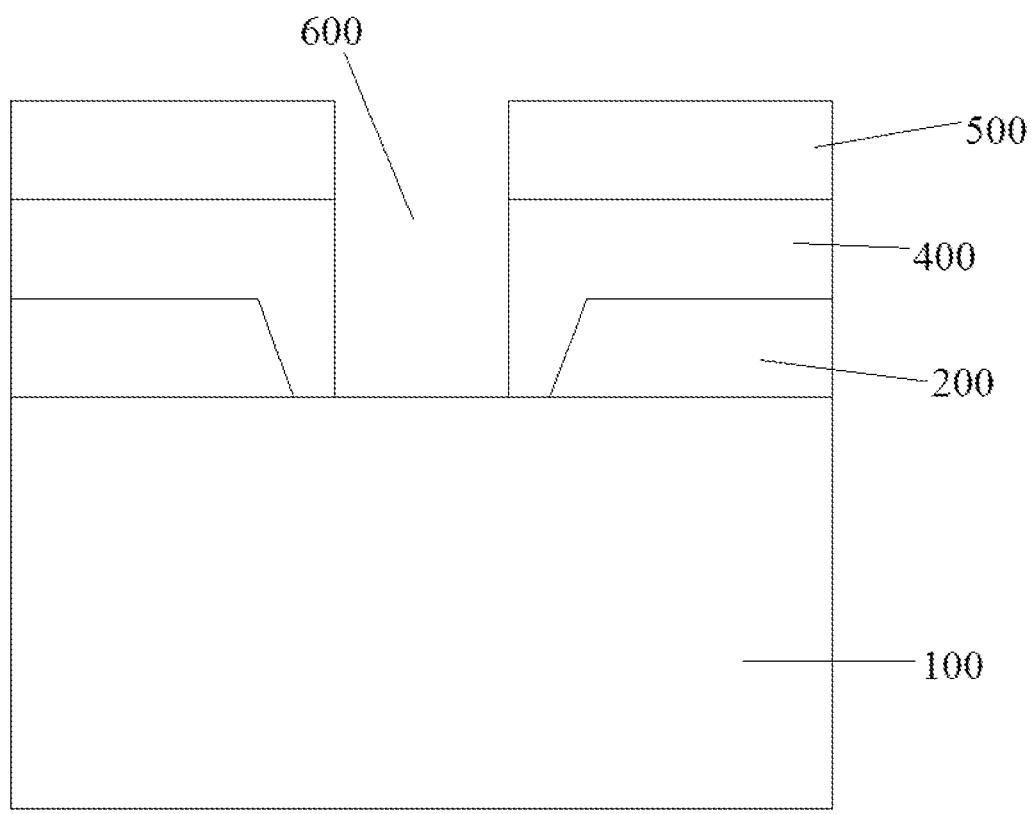
FIG. 6 is a schematic diagram of a structure in which a contact hole is formed according to an embodiment of the present disclosure.

FIG. 6 is a schematic diagram of a structure in which a contact hole is formed according to an embodiment of the present disclosure.

As shown in FIG. 6,
S5: forming a contact hole 600, where the contact hole 600 penetrates the protection layer 400 and the dielectric layer 500 to the surface of the substrate 100, respectively.
S51: reflowing the substrate 100 with the protection layer 400 at a high temperature.
S52: ultrasonically cleaning the substrate 100 with the protection layer 400.
S521: removing a residual photoresist organic matter with a mixed liquid of sulfuric acid and hydrogen peroxide having a volume ratio of 2-8:1.
S522: removing impurity particles and a part of polymer with a mixed liquid of ammonium hydroxide, hydrogen peroxide and pure water having a volume ratio of 1:1:3-8.

Figure 7:
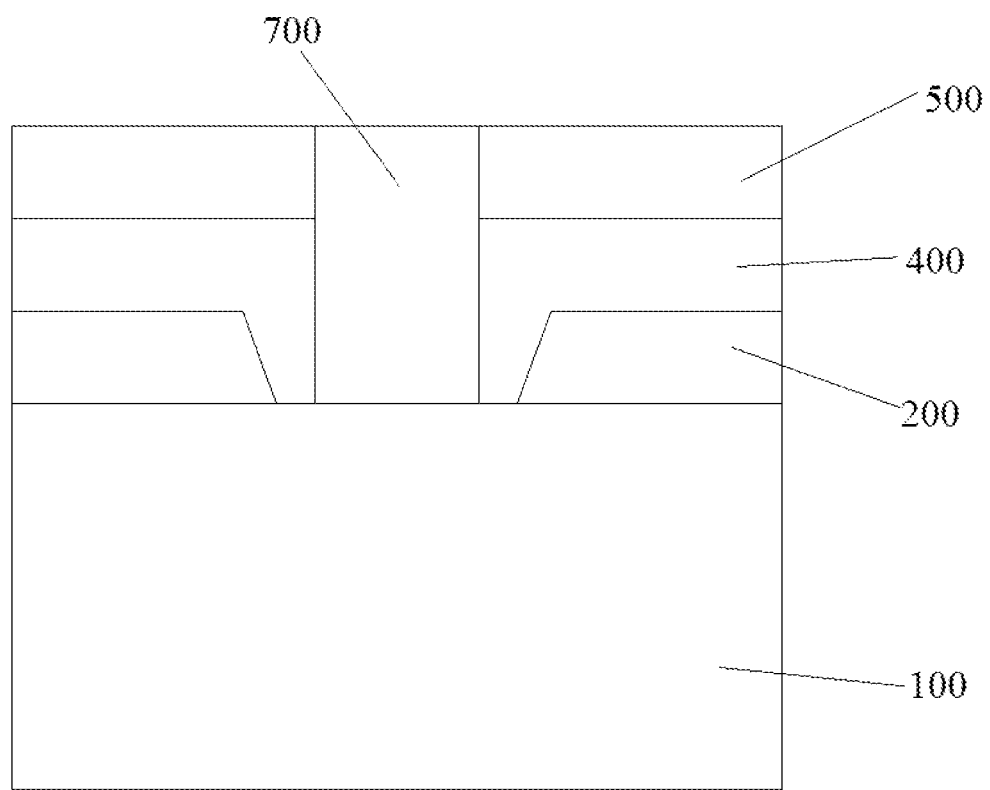
FIG. 7 is a schematic diagram of a structure in which a conductive plug is formed in the contact hole according to an embodiment of the present disclosure.

FIG. 7 is a schematic diagram of a structure in which a conductive plug is formed in the contact hole according to an embodiment of the present disclosure.

Figure 8:
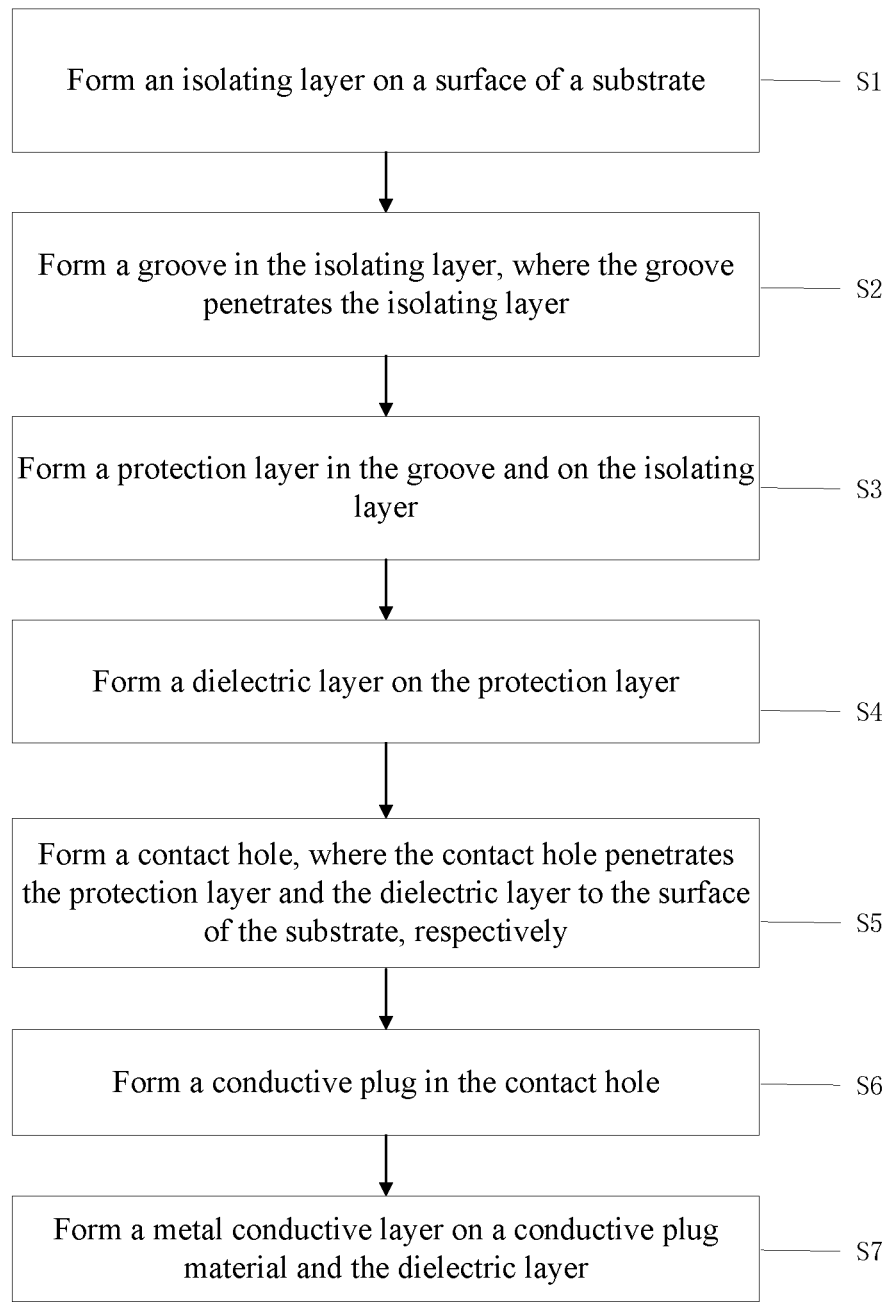
FIG. 8 is a flowchart of a method for manufacturing a semiconductor device according to another embodiment of the present disclosure.

FIG. 8 is a flowchart of the method for manufacturing the semiconductor device according to another embodiment of the present disclosure.

As shown in FIGS. 7 and 8,
S6: forming a conductive plug 700 in the contact hole 600.
S61: depositing a metal tungsten film with a physical vapor deposition method until each of the contact holes 600 is completely filled up with metal tungsten.

Figure 9:
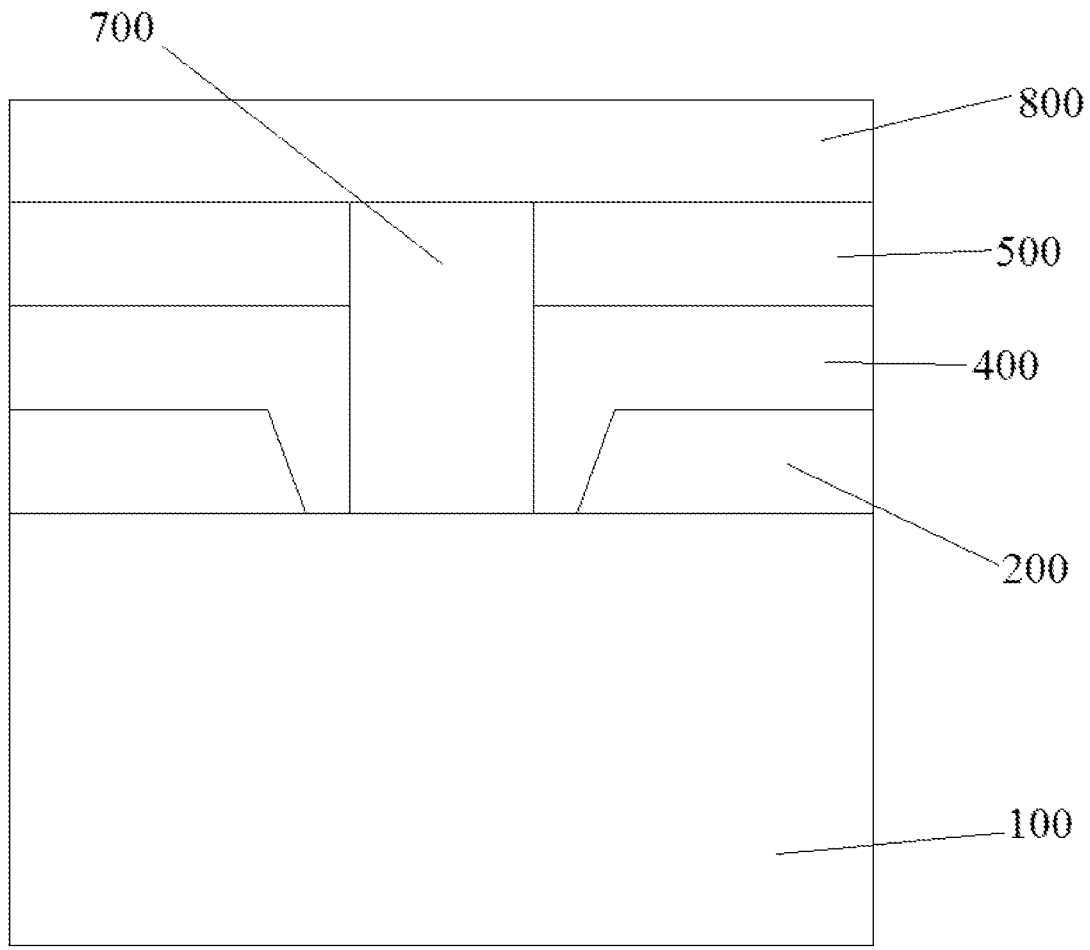
FIG. 9 is a schematic diagram of a structure in which a metal conductive layer is formed on the conductive plug and the dielectric layer according to an embodiment of the present disclosure.

FIG. 9 is a schematic diagram of a structure in which a metal conductive layer is formed on the conductive plug and the dielectric layer according to an embodiment of the present disclosure.

As shown in FIG. 9,
S7: forming the metal conductive layer 800 on the conductive plug 700 and the dielectric layer 500 to manufacture the semiconductor device.
S71: sputtering an aluminum metal layer on the conductive plug 700 and the dielectric layer 500 with a physical vapor deposition method.

The method for manufacturing the semiconductor device of the present disclosure can be used not only in chemical vapor deposition but also in a process of a metal wire of a short-circuit in physical vapor deposition. The method for manufacturing the semiconductor device of the present disclosure is simple and easy to operate. The method can also prevent the isolating layer 200 in a metal dielectric layer structure 500 from contacting formed phosphoric acid, protect integrity of the metal dielectric layer structure 500, and prevent a short circuit of the semiconductor device caused by the isolating layer 200 being easily corroded.

The method for manufacturing the semiconductor device can further include: forming the isolating layer 200 on the surface of the substrate 100; and forming the groove 300 in the isolating layer 200, where the groove 300 penetrates the insulation layer 200;

In an optional embodiment, the substrate 100 is made of a metal silicide.

In an optional embodiment, the isolating layer 200 is a silicon nitride film.

In an optional embodiment, the step of forming the isolating layer 200 on the surface of the substrate 100 can include: preparing a silicon nitride film on the surface of the substrate 100 with the chemical vapor deposition.

In an optional embodiment, the step of forming the groove 300 in the isolating layer 200 can include: arranging the groove 300 in the isolating layer 200 with dry etching.

In an optional embodiment, the step of forming the groove 300 in the isolating layer 200 can include: searching out and determining a position of the groove 300 via exposure and development.

In an optional embodiment, the isolating layer 200 in the groove 300 is configured as an etch stop layer for forming the contact hole.

In an optional embodiment, the method for manufacturing the semiconductor device can further include: forming the protection layer 400 in the groove 300 and on the isolating layer 200.

In an optional embodiment, the protection layer 400 is a borophosphosilicate glass film.

In an optional embodiment, the step of forming the protection layer 400 in the groove 300 and on the isolating layer 200 can include: preparing a layer of borophosphosilicate glass film in the groove 300 and on the isolating layer 200 with the chemical vapor deposition method.

In an optional embodiment, the method for manufacturing the semiconductor device can further include: forming the dielectric layer 500 on the protection layer 400.

In an optional embodiment, the dielectric layer 500 is a silicon dioxide film.

In an optional embodiment, the forming the dielectric layer 500 on the protection layer 400 can include: preparing a layer of silicon dioxide film on the protection layer 400 with a chemical vapor deposition method.

In an optional embodiment, the dielectric layer 500 has a thickness of greater than 200 nm. The protection layer 400 has a relatively small hardness, and a subsequent planarization process is likely to cause scratches. Depositing this layer of silicon dioxide film can reduce the occurrence of scratches.

In an optional embodiment, the method for manufacturing the semiconductor device can further include: forming the contact hole 600, where the contact hole 600 penetrates the protection layer 400 and the dielectric layer 500 to the surface of the substrate 100, respectively.

In the present disclosure, the reaction of the silicon nitride film with phosphoric acid causes structural loss. Further, in order to avoid the reaction of the film of other properties with other corrosive solutions that may be formed, this method is also applicable.

In an optional embodiment, the step of forming of the contact hole 600 can include: searching out the position of the groove 300 via exposure and development, and defining a position of the contact hole 600 according to the position of the groove 300.

In an optional embodiment, the step of forming the contact hole 600 can further include: etching the contact hole 600 at a defined position with a plasma dry etching process; and etching the reserved stop layer at a bottom of the contact hole 600.

In an optional embodiment, after the step of etching the stop layer at the bottom of the contact hole 600, the method can further include: excessively etching properly, such that the entire stop layer at the bottom of the contact hole 600 is etched completely until the contact hole 600 is completely formed.

In an optional embodiment, the method for manufacturing the semiconductor device can further include: forming a conductive plug material 700 in the contact hole 600.

In an optional embodiment, the conductive plug material 700 is metallic tungsten.

In an optional embodiment, the method for manufacturing the semiconductor device can further include: forming the metal conductive layer 800 on the conductive plug material 700 and the dielectric layer 500.

In an optional embodiment, the dielectric layer 500 can be made of a low K material.

In an optional embodiment, the dielectric layer 500 can be made of silicon oxide.

In a preferred embodiment, the dielectric layer 500 can be the borophosphosilicate glass film.

In an optional embodiment, a cross-section area of a side of the groove 300 close to the substrate 100 gradually increases to the cross-section area of a side of the groove away from the substrate 100.

In an optional embodiment, the isolating layer 200 has a thickness of 20 to 50 nm. Due to a large number of electron traps in silicon nitride, electrons in the film has an extremely low mobility. A role of this isolating layer is to trap free charges and prevent the free charges from entering an active region, resulting in a drift of a threshold voltage. This isolating layer is also configured as the etch stop layer for forming a subsequent contact hole.

In an optional embodiment, the protection layer 400 has a thickness of greater than 200 nm. A role of this protection layer is to absorb a small amount of moisture and trap free impurity metal ions.

In an optional embodiment, after the protection layer 400 is formed in the groove 300 and on the isolating layer 200, the method can further include: reflowing at a high temperature. The high-temperature reflow can make film layers (that is, the isolating layer 200 and the protection layer 400) tighter.

The high-temperature reflow is performed after the dielectric layer 500 is deposited, so that the dielectric layer 500 has good step coverage and compactness.

In an optional embodiment, after the step of forming the contact hole 600, the method can further include: ultrasonically cleaning. In this process, even if the precipitated phosphorus combines with water to form phosphoric acid, since the silicon nitride layer is isolated from the contact hole, the isolating layer 200 does not react with phosphoric acid, which effectively protects a role of the isolating layer 200 of blocking charges.

In an optional embodiment, the ultrasonically cleaning can include: removing the residual photoresist organic matter with a mixed liquid of sulfuric acid and hydrogen peroxide having a volume ratio of 2 to 8:1.

In an optional embodiment, the ultrasonically cleaning may include: removing the impurity particles and a part of polymer with the mixed liquid of ammonium hydroxide, hydrogen peroxide and pure water having a volume ratio of 1:1:3-8.

In an optional embodiment, after the step of forming the dielectric layer 500 on the protection layer 400, the method can further include: polishing a surface of the dielectric layer 500 with chemical mechanical polishing technology. Polishing can help the subsequent metal conductive layer 800 to be uniformly deposited.

In an optional embodiment, the step of forming the metal conductive layer 800 on the conductive plug 700 and the dielectric layer 500 can include: sputtering an aluminum metal layer on the conductive plug 700 and the dielectric layer 500 with the physical vapor deposition method to form a conducting circuit.

In an optional embodiment, the step of forming the conductive plug 700 in the contact hole 600 can include: depositing the metal tungsten film with the physical vapor deposition method until each of the contact holes 600 is completely filled up with metal tungsten.

In an optional embodiment, the step of forming the conductive plug 700 in the contact hole 600 can further include:
  removing metal tungsten outside the contact hole 600 with the chemical mechanical polishing technology, so that a top of a metal tungsten plug and a top of a region covered by the dielectric layer 500 are at a same level.
  In another embodiment of the present disclosure, there is provided a semiconductor device, which is manufactured with the method in any one of the forgoing solutions.

In another embodiment of the present disclosure, there is provided a semiconductor device, including: a substrate 100, where a dielectric layer 500, a protection layer 400, and an isolating layer 200 are stacked on the surface of the substrate 100 in sequence, and a surface of the substrate 100 is directly covered with the isolating layer 200; a contact hole 600, where the contact hole penetrates the dielectric layer 500, the protection layer 400 and the isolating layer 200, where a connection position between the isolating layer 200 and the contact hole 600 is covered with the protection layer 400.

In the present disclosure, the reaction of the silicon nitride film with phosphoric acid causes structural loss. Further, in order to avoid the reaction of the film of other properties with other corrosive solutions that may be formed, this structure is also applicable.

In an optional embodiment, the semiconductor device can further include: a conductive plug 700, where the contact hole 600 is filled up with the conductive plug 700.

In an optional embodiment, the semiconductor device can further include: a metal conductive layer 800, where the metal conductive layer 800 is provided on a surface of the dielectric layer 500 away from the substrate 100, and the conductive plug 700 and the dielectric layer 500 are covered with the metal conductive layer 800.

The present disclosure is intended to protect a method for manufacturing a semiconductor device, and a semiconductor device. The method can include: preparing an isolating layer 200 on a surface of a substrate 100; arranging a groove 300 at the isolating layer 200, where the groove 300 penetrates the isolating layer 200, the groove 300 has a shape of a prism frustum or a circular truncated cone, and a cross-section area of a side of the groove 300 close to the substrate 100 is greater than a cross-section area of a side of the groove 300 away from the substrate 100; forming a protection layer 400 in the groove 300 and on the isolating layer 200; forming a dielectric layer 500 on the protection layer 400; forming a contact hole 600, where the contact hole 600 penetrates the protection layer 400 and the dielectric layer 500 to the surface of the substrate 100, respectively; forming a conductive plug 700 in the contact hole 600; and forming a metal conductive layer 800 on the conductive plug 700 and the dielectric layer 500 to manufacture the semiconductor device. The method for manufacturing the semiconductor device of the present disclosure can be used not only in chemical vapor deposition but also in a process of a metal wire of a short-circuit in physical vapor deposition. The method for manufacturing the semiconductor device of the present disclosure is simple and easy to operate. The method can also prevent the isolating layer 200 in a metal dielectric layer structure 500 from contacting formed phosphoric acid, protect integrity of the metal dielectric layer structure 500, and prevent the short circuit of the semiconductor device caused by the isolating layer 200 being easily corroded.

It should be understood that the foregoing specific implementations of the present disclosure are only used to exemplify or explain the principle of the present disclosure, and do not constitute a limitation to the present disclosure. Therefore, any modification, equivalent replacement, improvement, or the like made without departing from the spirit and scope of this application shall be included in the protection scope of the present disclosure. In addition, the appended claims of the present disclosure are intended to cover all changes and modifications that fall within the scope and boundary of the appended claims or equivalent forms of such scope and boundary.

What is claimed is:

1. A method for manufacturing a semiconductor device, comprising:

forming an isolating layer on a surface of a substrate, wherein the isolating layer is a silicon nitride film;

forming a groove in the isolating layer, wherein the groove penetrates the isolating layer;

forming a protection layer in the groove and on the isolating layer, wherein the protection layer is a borophosphosilicate glass film;

forming a dielectric layer on the protection layer, wherein a top surface of the dielectric layer distal from the substrate is a flat surface;

forming a contact hole, wherein the contact hole penetrates the protection layer and the dielectric layer to the surface of the substrate, respectively; and ultrasonically cleaning.

2. The method for manufacturing the semiconductor device according to claim 1, further comprising:

forming a conductive plug in the contact hole; and forming a metal conductive layer on the conductive plug and the dielectric layer.

3. The method for manufacturing the semiconductor device according to claim 2, wherein said forming a metal conductive layer on the conductive plug and the dielectric layer comprises:

sputtering an aluminum metal layer on the conductive plug and the dielectric layer with a physical vapor deposition method.

4. The method for manufacturing the semiconductor device according to claim 1, wherein the isolating layer has a thickness of 20 to 50 nm.

5. The method for manufacturing the semiconductor device according to claim 1, wherein the protection layer has a thickness of greater than 200 nm.

6. The method for manufacturing the semiconductor device according to claim 1, wherein after said forming the protection layer in the groove and on the isolating layer, the method further comprises:

reflowing at a high temperature.

7. The method for manufacturing the semiconductor device according to claim 1, wherein said ultrasonically cleaning comprises:

removing a residual photoresist organic matter with a mixed liquid of sulfuric acid and hydrogen peroxide having a volume ratio of 2 to 8:1; and removing impurity particles and a part of polymer with a mixed liquid of ammonium hydroxide, hydrogen peroxide and pure water having a volume ratio of 1:1:3 to 8.

8. The method for manufacturing the semiconductor device according to claim 1, wherein after said forming the dielectric layer on the protection layer, the method further comprises:

polishing a surface of the dielectric layer with chemical mechanical polishing technology.

9. The method for manufacturing the semiconductor device according to claim 1, wherein said forming a conductive plug in the contact hole comprises:

depositing a metal tungsten film with the physical vapor deposition method until each of the contact holes is completely filled up with metal tungsten.

10. A semiconductor device manufactured with the method according to claim 1.

* * * * *